United States Patent [19]

Manning

[11] Patent Number: 5,055,426
[45] Date of Patent: Oct. 8, 1991

[54] METHOD FOR FORMING A MULTILEVEL INTERCONNECT STRUCTURE ON A SEMICONDUCTOR WAFER

[75] Inventor: Monte Manning, Kuna, Id.

[73] Assignee: Micron Technology, Inc., Boise, Id.

[21] Appl. No.: 580,212

[22] Filed: Sep. 10, 1990

[51] Int. Cl.$^5$ ............................................. H01L 21/90
[52] U.S. Cl. ...................................... 437/195; 437/187; 437/192; 437/194
[58] Field of Search ................. 437/195, 192, 187, 194

[56] References Cited

U.S. PATENT DOCUMENTS

| | | | |
|---|---|---|---|
| 4,451,326 | 5/1984 | Gwozdz | 437/198 |
| 4,764,484 | 8/1988 | Mo | 437/195 |
| 4,789,648 | 12/1988 | Chow et al. | 437/195 |
| 4,840,923 | 6/1989 | Flagelto et al. | 437/195 |

FOREIGN PATENT DOCUMENTS

| | | | |
|---|---|---|---|
| 60-076143 | 4/1985 | Japan | 437/187 |
| 60-140720 | 7/1985 | Japan . | |
| 61-171151 | 8/1986 | Japan | 437/195 |
| 63-306643 | 12/1988 | Japan | 437/195 |

Primary Examiner—Brian E. Hearn
Assistant Examiner—Laura M. Holtzman
Attorney, Agent, or Firm—Wells, St. John & Roberts

[57] ABSTRACT

A method for forming lower levels of metal in multilevel interconnects involves initial formation of a polymetal dielectric layer having grooves and contact holes, subsequent deposition of a covering layer of metal, masking of the covering layer and etching to produce protruding pillars, and addition of an intermetal dielectric layer surrounding the pillars. The process steps produce a metal level having integral studs or posts, conduction strips and contacts.

18 Claims, 4 Drawing Sheets

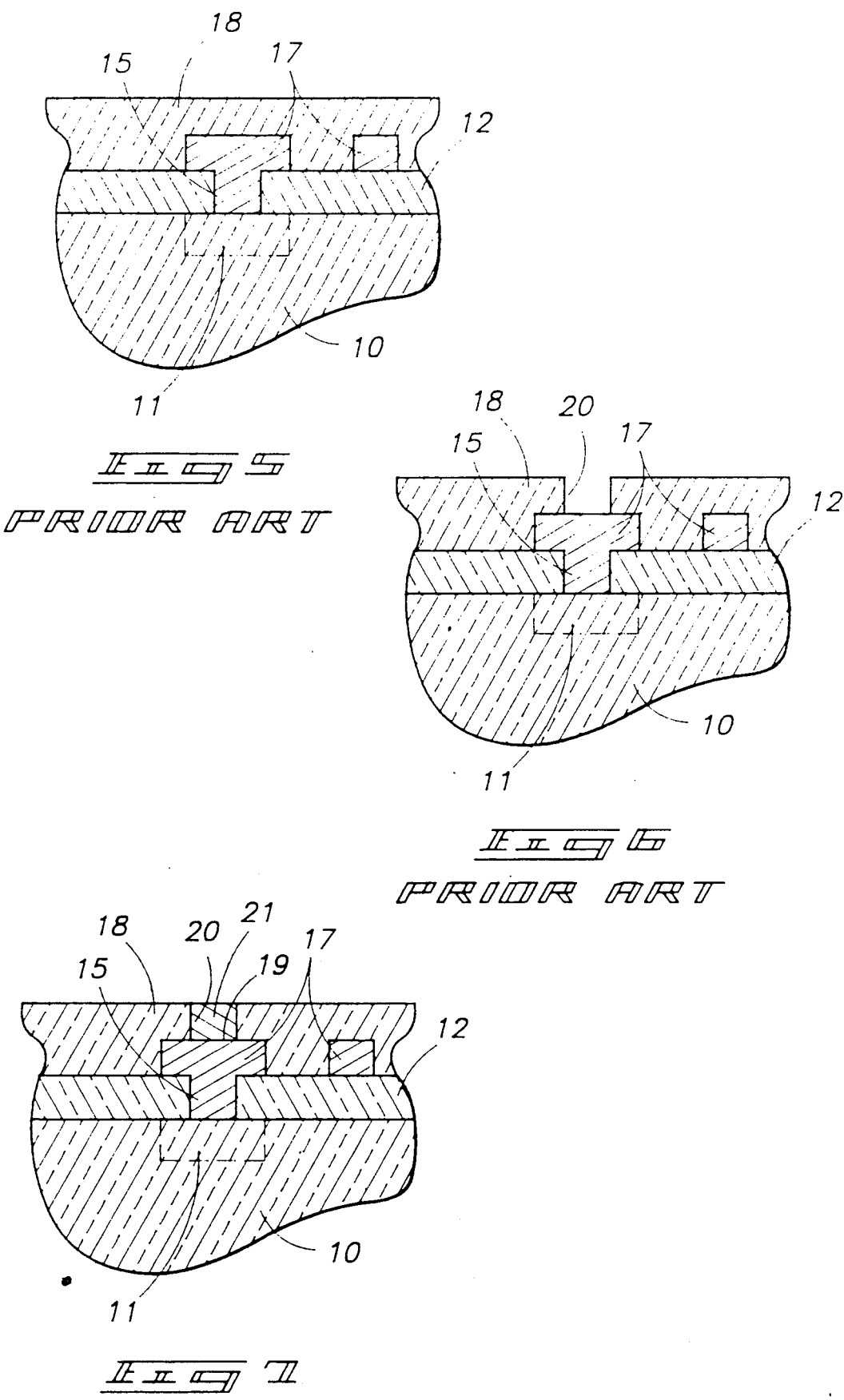

METHOD FOR FORMING A MULTILEVEL INTERCONNECT STRUCTURE ON A SEMICONDUCTOR WAFER

TECHNICAL FIELD

This invention relates generally to the formation of multilevel electrically conductive metal paths between parallel interconnect lines and exposed electrically conductive areas on a semiconductor wafer.

BACKGROUND OF THE INVENTION

At some point in semiconductor wafer processing, it becomes necessary to make conductive connections to exposed electrically conductive areas on a semiconductor wafer, such as active electronic device areas and interconnecting lines. Typically, interconnecting lines need to be formed elevationally above such areas to extend to other parts of the circuitry or to larger bonding pads to provide interconnect points for the finished die.

Throughout the evolution of integrated circuits, the aim of device scaling has been twofold: (1) to increase circuit performance (mainly by increasing circuit speed), and (2) to increase the functional complexity of the circuits. At the outset, scaling down of active device sizes was a very effective means of achieving these goals. Eventually, the scaling of active devices became less profitable, as the limitations of the circuit speed and maximum functional density came to depend more on the characteristics of the interconnects than on the scaled devices. In addition, the aspects of silicon utilization, chip cost, and ease and flexibility of integrated circuit design were also adversely affected by interconnect-technology restrictions.

The approaches to lifting these limitations have predominantly involved the implementation of multilevel-interconnect schemes. The typical method for forming these perpendicular conductive paths between metal levels and establishing contact with underlying areas of conductive interconnect lines or active device areas about wafers and dies has employed the step of first applying a thick layer of insulating material, such as SiO$_2$. A layer of photoresist is then applied to the insulating layer and selectively exposed and developed. Next, the wafer is etched to define vertical contact holes extending to selected active areas or interconnecting lines.

Deposition of a metal layer and subsequent etching results in a Metal layer that includes a first level of conduction strips and perpendicular contacts leading to selected active areas and/or interconnecting conductors.

After application of an interlevel dielectric layer, the process is repeated to form an additional Metal layer. Additional levels of dielectric and metal can be added to complete the metallization process.

Because perpendicular interconnecting posts or studs are required between spaced metal levels in multilevel interconnect structures, three metal depositions must usually occur—the first forms contacts to the underlying electrically conductive areas, such as active electronic device areas, and a first level of conduction strips about the wafer; the second forms the required posts, and the third forms the conduction strips of the next metal level.

Where tungsten is employed as the first level metal, the first two applications of metal involve deposition of tungsten, which is typically a very expensive process. The present method negates the need for the second deposition of tungsten, using instead the first metal deposition (which can be accomplished by an suitable metallurgical process) to form pillars extending outward from the first metal level.

Prior processes require substantial care to assure that good ohmic contact is established between the plugs as they are being formed and the underlying metal level. The present invention eliminates this concern by producing the plugs as integral pillars in the first level metal structure.

BRIEF DESCRIPTION OF THE DRAWINGS

The preferred embodiment of the invention is illustrated in the accompanying drawings, in which:

FIGS. 1–7 schematically illustrate a prior art process for producing a Metal 1 level in a multilevel interconnect structure.

DETAILED DESCRIPTION OF THE PREFERRED EMBODIMENTS

Figure 1:
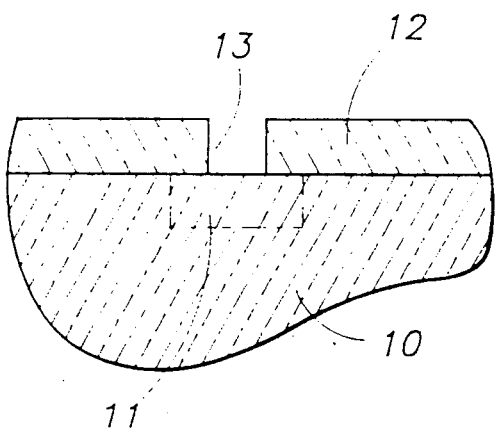
Figure 2:
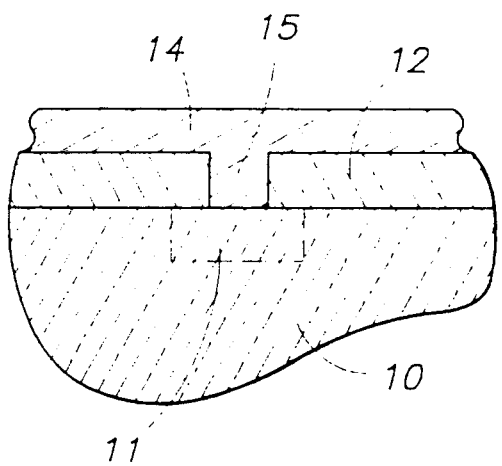
Figure 3:
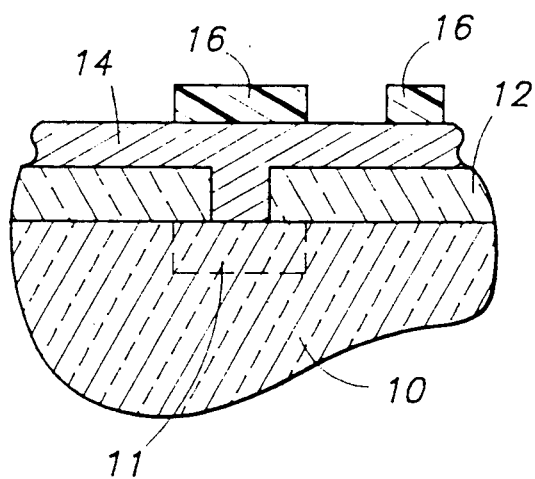
Figure 4:
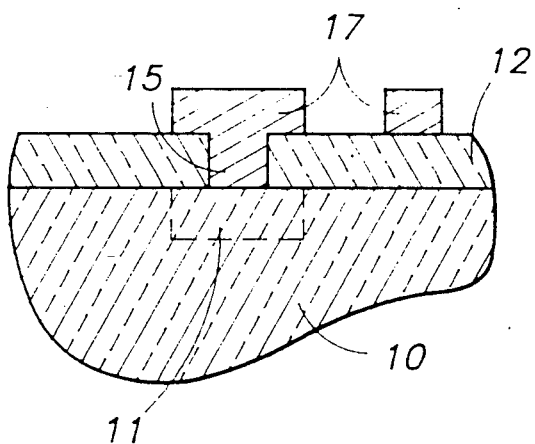

The following disclosure of the invention is submitted in furtherance with the constitutional purpose of the Patent Laws "to promote the progress of science and useful arts" (Article 1, Section 8).

While not limited to any specific metals, the present process has been specifically designed to utilize tungsten as a Metal 1 level (and as a material for subsequent intermediate metal levels) in multilevel interconnect structures. The advantages of tungsten in this role are its excellent resistance to electromigration effects, hillock formation and humidity-induced corrosion and its ability to be deposited by means of chemical vapor deposition (CVD) processes. CVD application of tungsten results in much better step coverage than can be obtained by sputter-deposited or evaporated films (such as aluminum). The use of selective CVD processes in the application of tungsten allows it to be concentrated in specific areas about the wafer as needed to fill contact holes and vias that have very high aspect ratios.

While CVD-deposited tungsten facilitates the filling of contact holes and vias within lower levels of metal in multilevel interconnect structures, aluminum is generally used as the top level of metal because wire-bonding technology to aluminum thin films is a well-characterized process.

Current production processes for fabrication of each metal level involves initial formation of the lower inwardly protruding vias or contacts and any associated planar conduction strips, followed by subsequent formation of stubs or posts leading to the next metal level. This not only requires two depositions of metal to complete the single metal level, but risks the development of less-than-desirable electrical connections across the resulting intermediate metal junctions.

FIGS. 1–7 illustrate a typical known process (prior art) for producing a Metal 1 level on a wafer substrate 10 having an upwardly exposed active area 11 to which exterior electrical contact must be established.

The first step (FIG. 1) involves application of dielectric, such as a layer of doped silicon dioxide film 12 applied by chemical vapor deposition processes. The layer of silicon dioxide 12 shown in FIG. 1 has been subjected to contact patterning to produce a contact hole 13 leading to the exposed surface of active area 11 in substrate 10.

A first layer of metal 14 is then deposited on the wafer (FIG. 2), filling contact hole 13 and forming a contact 15 in electrical communication with the active area 11. A layer of barrier metal (not shown) can be interposed under the layer of metal 14 as required.

Next, a layer of resist 16 (FIG. 3) is masked and developed on the layer of metal 14, leaving a pattern corresponding to the desired layer of conduction strips required in the Metal 1 level. The resulting conduction strips, labeled as 17 (FIG. 4) and contacts 15 are thereby integrally formed for inclusion within the Metal 1 level.

An intermetal dielectric 18, such as silicon dioxide, is then applied over the first layer of conduction strips 17 (FIG. 5). It is masked and etched to form vias 20 (FIG. 6) as required for electrical interconnections to the underlying conduction strips 17. Metal studs or plugs 21 can then be formed within the vias 20 (FIG. 7) to complete the Metal 1 level. When using tungsten as the metal material within Metal 1 level, it can be applied by selective chemical vapor deposition to fill the vias 20 or can be applied in a covering layer, which must then be planarized or etched back to expose the outer surfaces of the plugs 21 for subsequent contact with the top metal level (not shown), which will typically be formed from an aluminum thin film.

The above process involves two depositions of metal to form the Metal 1 level. Besides being expensive, it risks formation of poor electrical contact in the intermediate surface areas 19 where the two layers of metal engage one another between studs or posts 21 and the conduction strips 17.

In accordance with the invention, a method for forming a multilevel interconnect structure on a semiconductor wafer comprises selectively fabricating a wafer by depositing and patterning different conductive and insulating layers, and by doping, to begin producing electronic devices and desired integrated circuits on the wafer. The wafer is fabricated to include exposed electrically conductive areas. By way of example only, such conductive areas could be active areas of electronic devices being formed on the wafer, or areas of conductive interconnect lines.

A first dielectric layer is applied on the wafer, and portions removed to form a poly-metal dielectric layer having grooves corresponding to a layer of conduction strips, the grooves being intersected by contact holes in communication with underlying electrically conductive areas on the wafer. A first metal layer is applied on the wafer to fill both the grooves and contact holes and also to cover the remaining surface areas of the poly-metal dielectric layer to begin definition of a Metal level. Portions of the first metal layer are removed to the depth of the poly-metal dielectric layer, leaving pillars protruding integrally from conduction strips and contacts in the Metal level.

FIGS. 8-15 illustrate the steps of the preferred method. To summarize the preferred method, a first dielectric layer is initially applied to the underling substrate. This layer has sufficient thickness to accommodate the thickness of the required conduction strips and contacts within the Metal 1 level. It is etched to form a poly-metal dielectric layer having outer grooves corresponding to a layer of conduction strips. The grooves in turn are intersected by contact holes in communication with underlying active areas of the electronic devices on the wafer or substrate. The dielectric layer is then completely covered with metal to both fill the grooves and contact holes and also cover its remaining surface areas, thus beginning definition of the Metal 1 level. The metal layer can then be etched back to leave integral pillars protruding from the conduction strips and contacts in a Metal 1 level.

This method involves only one application of metal to produce the contacts, conduction strips, and pillars. Their integral structure eliminates the problems associated with inter-layer junctions and metal joints.

While the following description relates specifically to the steps necessary to produce a Metal 1 level of tungsten, it is to be understood that other metals and alloys can be substituted, and that alternative metal deposition processes can be utilized in carrying out the described process.

Figure 8:
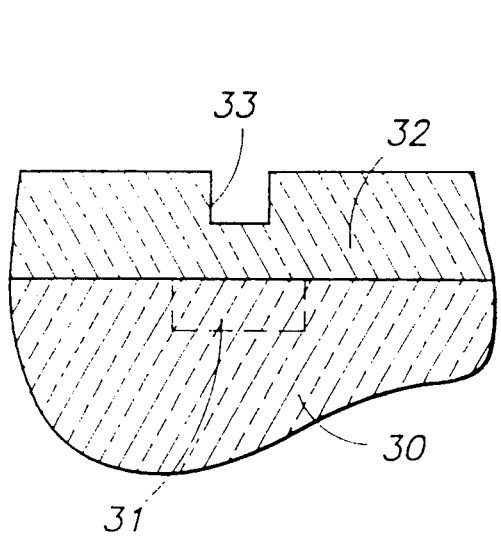
FIGS. 8–15 illustrate the steps involved in one embodiment of the present improved process.
Figure 9:
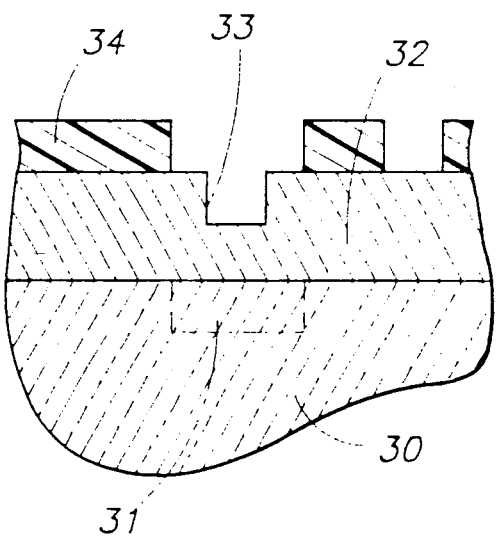
Figure 10:
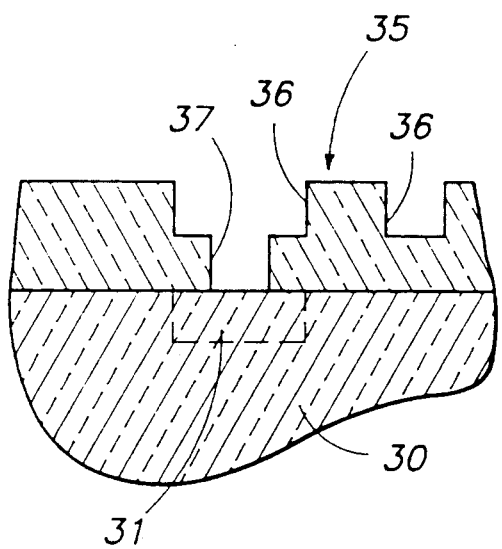

FIG. 8 illustrates an underlying wafer substrate 30 having an active area 31 to which electrical contact must be made. The surface of substrate 30 is initially covered by a relatively thick layer of dielectric 32, which will typically be doped silicon dioxide, although other suitable dielectric can be substituted as desired. A first mask (not shown) is applied over the dielectric layer 32 and contact holes 33 are partially patterned into it, but not etched to completion. Next, the dielectric layer 32 is covered by resist 34 (FIG. 9), which is masked and developed to provide a pattern corresponding to the desired conduction strips in the Metal 1 level. Subsequent etching of the dielectric layer 32 forms a poly-metal dielectric layer 35 shown in FIG. 10.

The etched dielectric layer 35 has grooves 36 corresponding to the conduction strips to be formed in the Metal 1 level. The grooves 36 are intersected by contact holes 37 in communication with the underlying electrically conductive areas, illustrated as active areas 31 of the electronic devices on the substrate 30. The contact holes 37 are etched to completion as the grooves 36 are etched into the surface of the poly-metal dielectric layer 35.

Figure 11:
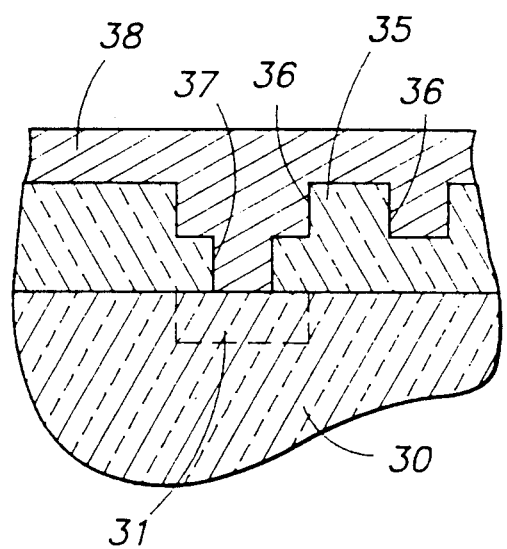

After patterning of the grooves 36 and contact holes 37, a layer of metal 38 is then deposited over the entire wafer (FIG. 11). The deposition should be such that the minimum thickness of metal is at least greater than half the widest metal groove 36. This will insure that all grooves are completely filled to the level of the surrounding metal outside the grooves 36. Again, while tungsten provides the easiest method to accomplish this end, aluminum might be flowed into the grooves during deposition, and other metals or alloys and other metal deposition techniques might be employed. In addition, a layer of barrier metal (not shown) can be applied prior to the primary metal depositions step.

Figure 12:
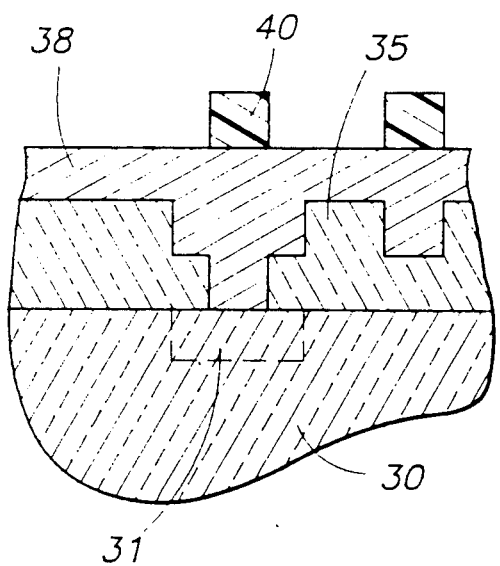
Figure 13:
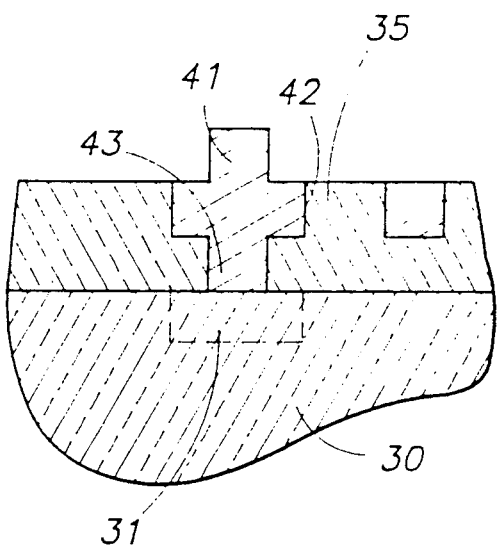

Before etching back the metal layer (as is conventional in the processes currently being used), a pattern of resist 40 is produced on its outer surface to define areas where studs are desired in the finished Metal 1 level. This is illustrated in FIG. 12. After such patterning, the metal is etched to the level of the dielectric layer 35 (FIG. 13), leaving protruding pillars 41 extending outward from conduction strips 42 and contact 43. The integral pillars 41, conduction strips 42 and contacts 43 form the Metal 1 level for the multilevel interconnect structure.

Figure 14:
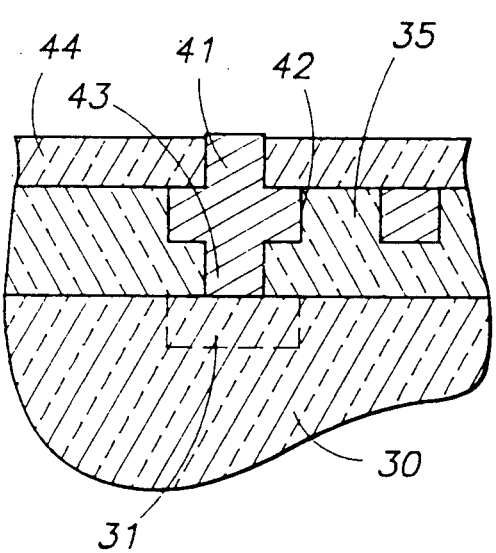

After formation of pillars 41, the remaining resist is removed from them and a layer of intermetal dielectric is deposited on the wafers. The dielectric is then planarized to expose the top surfaces of pillars 41 as shown in FIG. 14. This can be accomplished by either chemicalmechanical polish, by resist etchback, or by any other method capable of producing a planar dielectric surface from one that is non-planar.

Since the pillars 41 are formed by using the same metal deposition step as is used for the underlying production of the conduction strips 42 and contact vias 43, the thickness of the intermetal dielectric layer 44 is bounded by the thickness of the metal deposition that forms the pillars. The thickness of dielectric layer 44 must be slightly less than the thickness of the metal that was deposited on the outer planar surfaces of the poly-metal dielectric layer 35. Because of this constraint, the dielectric thickness may be somewhat thicker than would be required in the intermetal dielectric layer in prior art processes where recessed metal levels have been used without the integrated pillars 41.

Note in FIG. 14 that the thickness of intermetal dielectric layer 44 is slightly less than the thickness of the stud or post formed by pillar 41. This slightly exposes the top of each pillar 41 to assure better electrical contact with a covering metallizing layer.

Where additional levels of interconnects are necessary, the process steps shown in FIGS. 8-14 can be repeated before adding the final metal layer. In each instance, the individual metal levels are produced using a single metal deposition step, rather than two.

Figure 15:
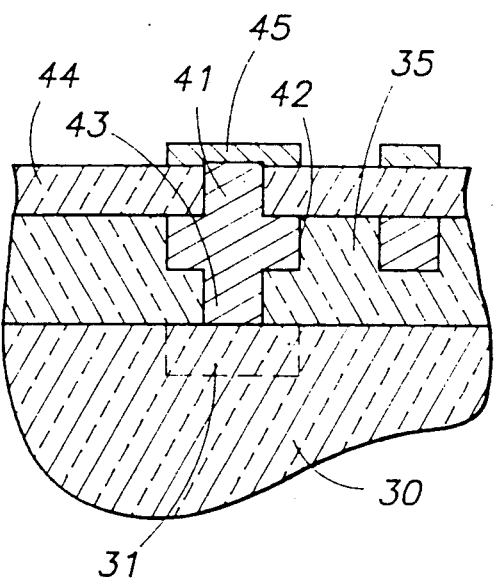

After planarizing the intermetal dielectric layer 44 to expose the pillars 41, a second metal layer can be deposited on the dielectric to complete electrical connections to the pillars 41 and Metal 1 level of the multilevel interconnect structure. FIG. 15 illustrate the second metal layer after etching or other patterning steps have been accomplished to produce conduction strips 45 in a desired top level pattern. Aluminum is generally used as the top level metal.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A method for forming a multilevel interconnect structure on a semiconductor wafer, wherein the interconnect structure includes a Metal level having inwardly protruding contact vias leading to underlying electrically conductive areas and outwardly protruding pillars leading to an overlying conductive layer, the method comprising the following steps:

selectively fabricating a wafer by depositing and patterning different conductive and insulating layers, and by doping, to begin producing electronic devices and desired integrated circuits on the wafer; the wafer being fabricated to include exposed electrically conductive areas;

applying a first dielectric layer on the wafer;

etching the dielectric to form a poly-metal dielectric layer having grooves corresponding to a first layer of conduction strips, the grooves being intersected by contact holes in communication with underlying electrically conductive areas on the wafer;

depositing a layer of tungsten on the wafer to both fill the grooves and contact holes and cover the remaining surface areas of the poly-metal dielectric layer to a common substantially planar surface; and etching back the tungsten to the poly-metal dielectric layer while forming protruding integral pillars at locations corresponding to about the filled grooves as required in a Metal level.

2. The method of claim 1, wherein the tungsten is deposited by chemical vapor deposition techniques.

3. The method of claim 1, further comprising the following step:
   surrounding the pillars with dielectric.

4. The method of claim 1, further comprising the following steps:
   depositing an intermetal dielectric layer on the wafer; and
   planarizing the intermetal dielectric layer to expose the tungsten pillars.

5. The method of claim 1, further comprising the following steps:
   depositing an intermetal dielectric layer on the wafer;
   planarizing the intermetal dielectric layer to expose the tungsten pillars; and
   depositing a layer of aluminum on the wafer.

6. The method of claim 5, wherein the planarizing step reduces the thickness of the intermetal dielectric layer to a dimension less than the thickness of the tungsten pillars, thereby slightly exposing the top of each tungsten pillar.

7. The method of claim 5, further comprising the following steps:
   etching the layer of aluminum to form a second layer of conduction strips.

8. The method of claim 1, wherein the electrically conductive areas constitute active areas of electronic devices being formed on the wafer.

9. The method of claim 1, wherein the electrically conductive areas constitute areas of conductive interconnect lines on the wafer.

10. A method for forming a multilevel interconnect structure on a semiconductor wafer, wherein the interconnect structure includes a Metal level having inwardly protruding contact vias leading to underlying electrically conductive areas and outwardly protruding pillars leading to an overlying conductive layer, the method comprising the following steps:

selectively fabricating a wafer by depositing and patterning different conductive and insulating layers, and by doping, to begin producing electronic devices and desired integrated circuits on the wafer; the wafer being fabricated to include exposed electrically conductive areas;

applying a dielectric layer on the wafer;

removing portions of the dielectric layer to form a poly-metal dielectric layer having grooves corresponding to a layer of conduction strips, the grooves being intersected by contact holes in communication with underlying electrically conductive areas on the wafer;

applying a metal layer on the wafer to fill both the grooves and contact holes and also to cover the remaining surface areas of the poly-metal dielectric layer to begin definition of a Metal level; and removing portions of the metal layer to the depth of the poly-metal dielectric layer, leaving pillars protruding integrally from conduction strips and contacts in the Metal level.

11. The method of claim 10, further comprising the following step:

surrounding the pillars with dielectric.

12. The method of claim 10, further comprising the following steps:
   depositing an intermetal dielectric layer on the wafer; and
   reducing the thickness of the intermetal dielectric layer to expose the tops of the pillars.

13. The method of claim 10, further comprising the following steps:
   depositing an intermetal dielectric layer on the wafer;
   reducing the thickness of the intermetal dielectric layer to the top surfaces of the pillars; and
   depositing a second metal layer on the wafer.

14. The method of claim 13, wherein the reducing step decreases the thickness of the intermetal dielectric layer to a dimension less than the thickness of the pillars, thereby slightly exposing the top of each pillar.

15. The method of claim 13, further comprising the following steps:
   removing selected portions of the second level metal to form an additional layer of conduction strips.

16. The method of claim 10 wherein the step of removing portions of the dielectric to form a poly-metal dielectric layer comprises the following steps:
   first patterning the contact holes to partially open them into the dielectric;
   then patterning grooves into the dielectric to a depth at which the previously-opened contact holes will be completed.

17. The method of claim 10, wherein the electrically conductive areas constitute active areas of electronic devices being formed on the wafer.

18. The method of claim 10, wherein the electrically conductive areas constitute areas of conductive interconnect lines on the wafer.

* * * * *